US012672268B1

(12) United States Patent
Milheim

(10) Patent No.: US 12,672,268 B1
(45) Date of Patent: Jun. 30, 2026

(54) RAXIAL FLOW FAN FOR COOLING OF AXIAL FLUX MACHINE AND DRIVE

(71) Applicant: E-Circuit Motors, Inc., Needham Heights, MA (US)

(72) Inventor: George Harder Milheim, Bozeman, MT (US)

(73) Assignee: E-Circuit Motors, Inc., Needham Heights, MA (US)

( * ) Notice: Subject to any disclaimer, the term of this patent is extended or adjusted under 35 U.S.C. 154(b) by 0 days.

(21) Appl. No.: 19/317,608

(22) Filed: Sep. 3, 2025

Related U.S. Application Data

(60) Provisional application No. 63/819,131, filed on Jun. 6, 2025.

(51) Int. Cl.
| | |
|---|---|
| *H05K 7/20* | (2006.01) |
| *F04D 17/08* | (2006.01) |
| *F04D 29/58* | (2006.01) |
| *H02K 7/14* | (2006.01) |

(52) U.S. Cl.
CPC ......... *H05K 7/20909* (2013.01); *F04D 17/08* (2013.01); *F04D 29/584* (2013.01); *H02K 7/14* (2013.01); *H05K 7/20945* (2013.01)

(58) Field of Classification Search
CPC ......... F04D 17/08; F04D 29/584; H02K 7/14; H05K 7/20945
See application file for complete search history.

(56) References Cited

U.S. PATENT DOCUMENTS

| | | | | |
|---|---|---|---|---|
| 4,861,237 A | * | 8/1989 | Shiraki | F04D 29/005 |
| | | | | 417/353 |
| 5,387,087 A | | 2/1995 | Chen | |
| 6,232,696 B1 | * | 5/2001 | Kim | F04D 29/441 |
| | | | | 417/423.2 |
| 6,514,052 B2 | | 2/2003 | Bostwick | |
| 7,109,625 B1 | | 9/2006 | Jore et al. | |
| 9,673,688 B2 | | 6/2017 | Shaw | |

(Continued)

FOREIGN PATENT DOCUMENTS

| | | | |
|---|---|---|---|
| CN | 216451251 U | * | 5/2022 |
| CN | 117040173 A | | 11/2023 |

(Continued)

OTHER PUBLICATIONS

CN-216451251-U, all pages (Year: 2022).*
DE-102022134926-A1, alll pages (Year: 2023).*

*Primary Examiner* — Naishadh N Desai

(74) *Attorney, Agent, or Firm* — Pierce Atwood LLP

(57) ABSTRACT

A centrifugal fan, positioned in a gap between a first surface and a second surface, includes blades extending in a radial direction and a baffle attached to the blades, the baffle being configured and arranged (i) to cause cooling fluid to be drawn into one or more first openings on a first axial side of the centrifugal fan that faces the first surface, thereby generating a first flow of cooling fluid in an inward radial direction over the first surface, and (ii) to redirect the fluid flow at least partially in an axial direction toward the second surface so that the cooling fluid is expelled from one or more second openings on a second axial side of the centrifugal fan that faces the second surface, thereby causing a second flow of cooling fluid in an outward radial direction over the second surface.

14 Claims, 6 Drawing Sheets

(56)           References Cited

U.S. PATENT DOCUMENTS

|  |  |  |  |  |
|---|---|---|---|---|
| 9,800,109 B2 | 10/2017 | Shaw | | |
| 10,170,953 B2 | 1/2019 | Shaw | | |
| 10,211,694 B1 | 2/2019 | Shaw | | |
| 10,819,187 B2 | 10/2020 | Bei et al. | | |
| 10,859,091 B2 | 12/2020 | Rakuff et al. | | |
| 11,005,322 B2 | 5/2021 | Milheim et al. | | |
| 11,121,614 B2 | 9/2021 | Milheim | | |
| 11,336,130 B1 | 5/2022 | Shaw et al. | | |
| 11,509,179 B2 | 11/2022 | Lee et al. | | |
| 11,527,933 B2 | 12/2022 | Shaw et al. | | |
| 11,626,779 B2 | 4/2023 | Shaw et al. | | |
| 11,751,330 B2 | 9/2023 | Milheim et al. | | |
| 2016/0053775 A1* | 2/2016 | Volker | ................. | F04D 29/281 |
| | | | | 415/203 |
| 2018/0238337 A1* | 8/2018 | Kneip | .................. | H02K 1/2733 |
| 2019/0273421 A1* | 9/2019 | Velderman | .............. | H02K 5/18 |
| 2021/0355957 A1 | 11/2021 | Takeishi et al. | | |

FOREIGN PATENT DOCUMENTS

| | | | | | |
|---|---|---|---|---|---|
| CN | 118677174 A | 9/2024 | | | |
| DE | 102022134926 A1 * | 7/2023 | ............ | H02K 11/30 | |
| FR | 3123695 B1 | 1/2024 | | | |

* cited by examiner

RAXIAL FLOW FAN FOR COOLING OF AXIAL FLUX MACHINE AND DRIVE

RELATED APPLICATIONS

This application claims the benefit under 35 U.S.C. § 119 (e) of U.S. Provisional Application Ser. No. 63/819,131, entitled RAXIAL FAN FOR COOLING OF AXIAL FLUX MACHINE AND DRIVE, filed Jun. 6, 2025, the entire contents of which are incorporated herein by reference for all purposes.

BACKGROUND

Axial flux motors and generators described by several patents, including U.S. Pat. Nos. 7,109,625; 9,673,688; 9,800,109; 10,170,953; 10,211,694; 11,005,322; 11,121, 614; 11,336,130; 11,527,933; 11,626,779; 11,751,330, the entire contents of which are incorporated herein by reference, feature a generally planar printed circuit board stator (PCB) assembly interposed between magnets magnetized with alternating north-south poles.

SUMMARY

Axial flux machines that employ PCB armatures are typically enclosed in sealed housings to prevent contamination of the magnets and stator. Heat generated in the stator and rotor components must be removed primarily through external cooling of the housing.

These machines are typically brushless and require power electronic components, commonly referred to as a "drive," to control current through a motor or generator at the correct frequency. The drive and the motor/generator produce heat which must be removed to prevent overheating. If the motor/generator and drive are integrated together they may be cooled by the same system. Disclosed herein is a novel centrifugal fan component which can be placed on a shaft between a drive and a motor/generator to enable both components to be cooled simultaneously. Advantageously, the centrifugal fan component may in include one or more openings on a first axial side to allow the inflow of a cooling fluid (e.g., air) into a body of the centrifugal fan component as it rotates and may include one or more features (e.g., an integrated baffle) configured to direct the flow of such cooling fluid at least partially in axial direction so that it exits the centrifugal fan component on a second axial side opposite the first axial side. Accordingly, when the centrifugal fan component is rotated together with the shaft, the cooling fluid is caused to flow in an inward radial direction over a surface of one of the housings (e.g., the drive housing or the motor/generator housing) as it is drawn into the opening(s) on the first axial side of the centrifugal fan component and is caused to flow in a radial outward direction over a surface of the other housing as it is exhausted from the second axial side of the centrifugal fan component.

DETAILED DESCRIPTION

Electric motors and generators and their drives are frequently integrated together such that the full system can be handled as a single unit. In an axial flux design, the drive circuit board is typically integrated on a plane perpendicular to the axis of rotation of the machine such that the overall assembly is axially thin. The drive may be mounted directly to the motor/generator housing or may be housed separately. It may be desirable to use a separate housing for the drive and mount it such that it is axially spaced from the motor/generator housing such that fluid flow (e.g., airflow) between the devices may cool both housings. A fan may be connected to the shaft of the axial flux machine and used to cool both the motor/generator housing and the drive housing.

Some previous solutions to simultaneous cooling of the motor/generator and drive, such as U.S. Pat. No. 11,509,179, use a stationary baffle to separate airflow between the axially spaced motor and drive such that air is drawn radially inward through fins placed on the drive housing and blown radially outward over fins on the motor housing. This solution requires two separate components (i.e., a baffle and a fan) to be placed between the drive housing and motor housing.

Another solution would be to use an axial flow fan to pull air from the housing on one side and blow it over the housing on the other. This solution would use only a single part, but the axial flow fan reverses the direction of airflow when the rotation direction changes. This may be undesirable for a general purpose machine which may be used in applications turning in either direction.

In accordance with some embodiments of the present disclosure, the benefits of both a baffle and a radial flow fan may be obtained using a single component such that air or another cooling fluid may be drawn axially inward on one side and directed, in a combined axial and radial direction, to flow outward on the other side. The flow of cooling fluid (e.g., air) in a combined axial and radial direction is sometimes referred to herein as "raxial" flow, and the example components disclosed herein that are configured to generate such raxial flow are sometimes referred to herein as a "raxial" flow fans.

Figure 1:
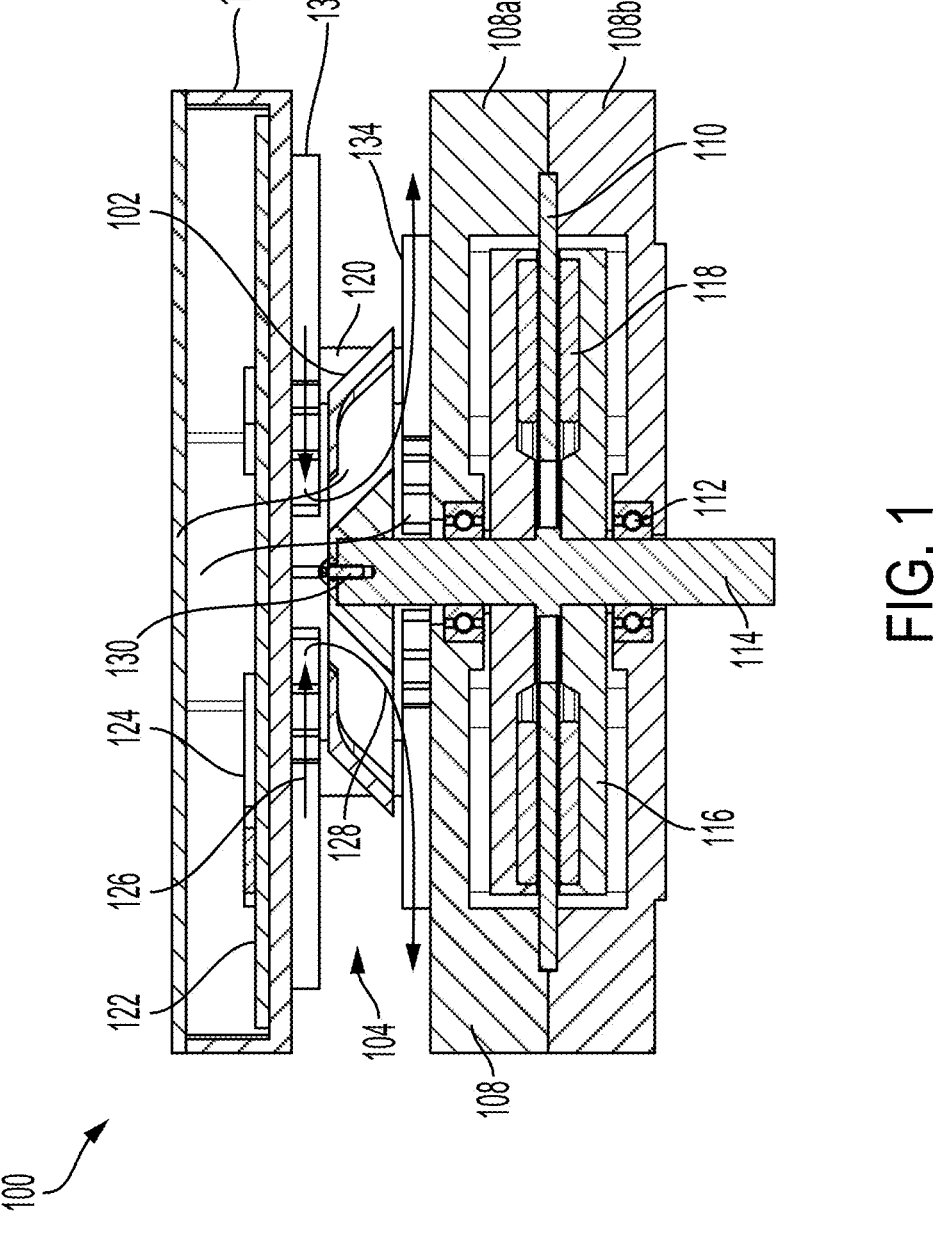
FIG. 1 shows how a first example centrifugal fan component, configured in accordance with some implementations of the present disclosure, may be disposed between a drive housing and a motor/generator housing of an integrated axial flux machine.
Figure 2:
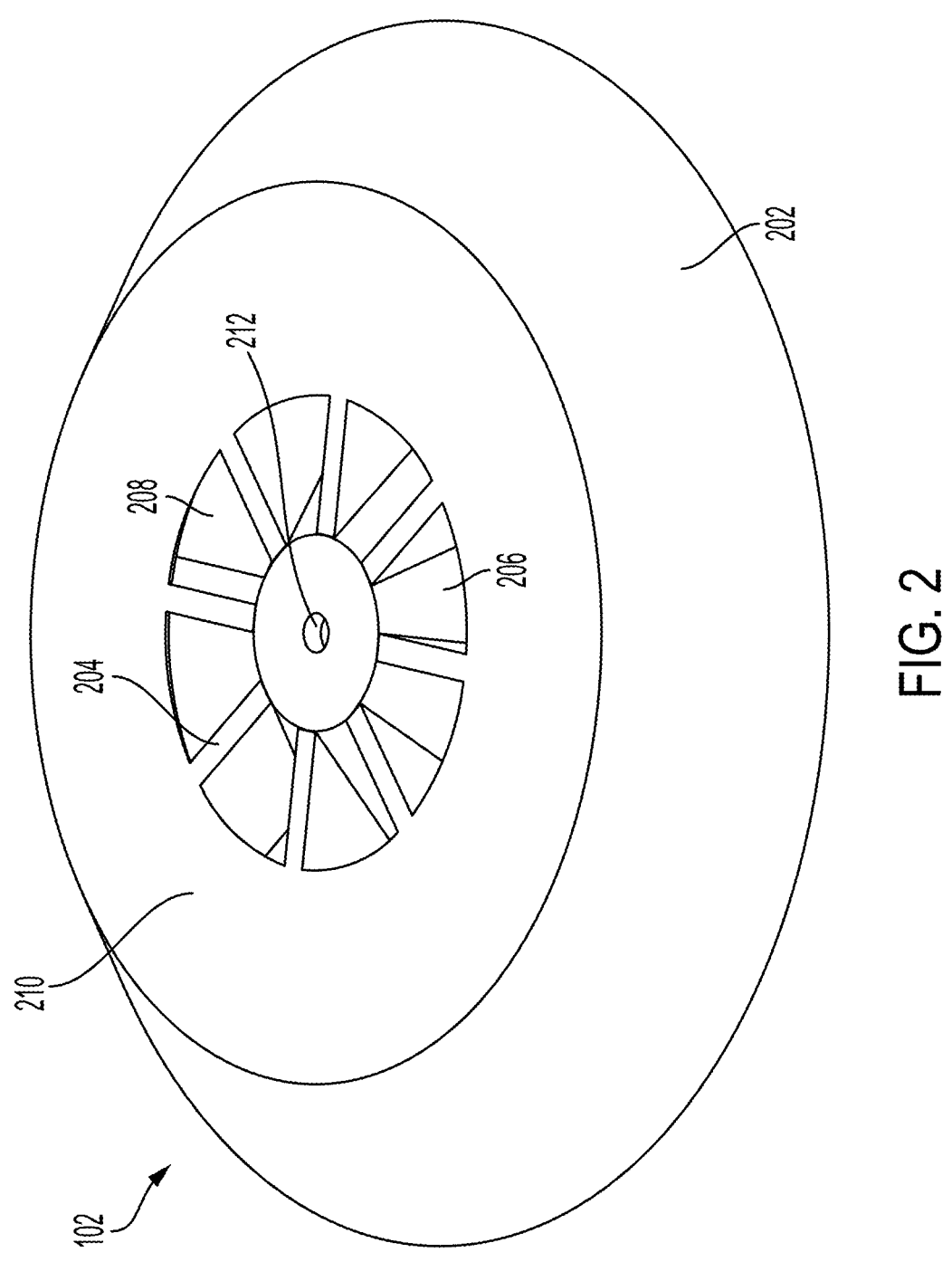
FIG. 2 shows a top view of the first example centrifugal fan component shown in FIG. 1.
Figure 3:
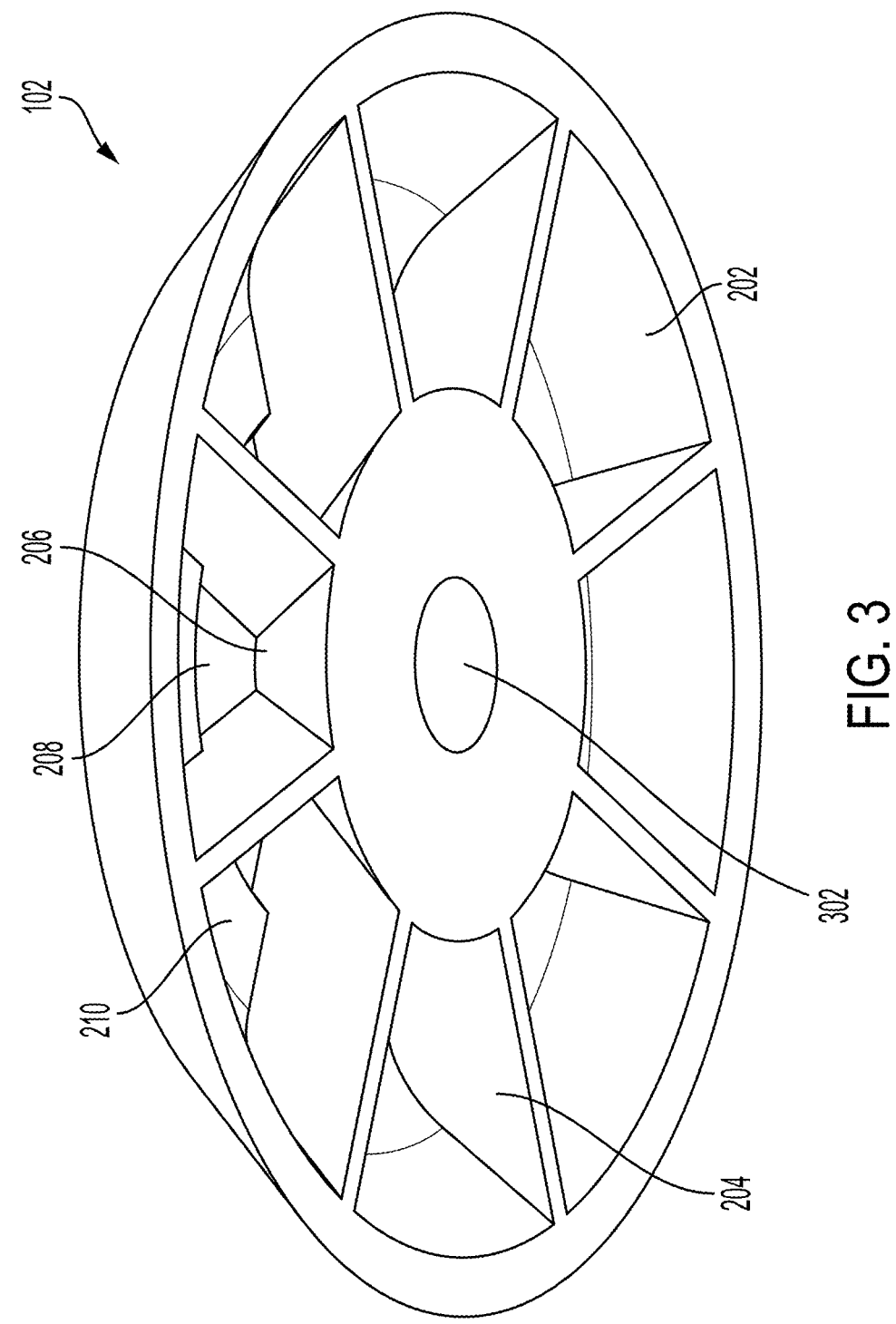
FIG. 3 shows a bottom view of the first centrifugal fan component shown in FIG. 1.
Figure 4:
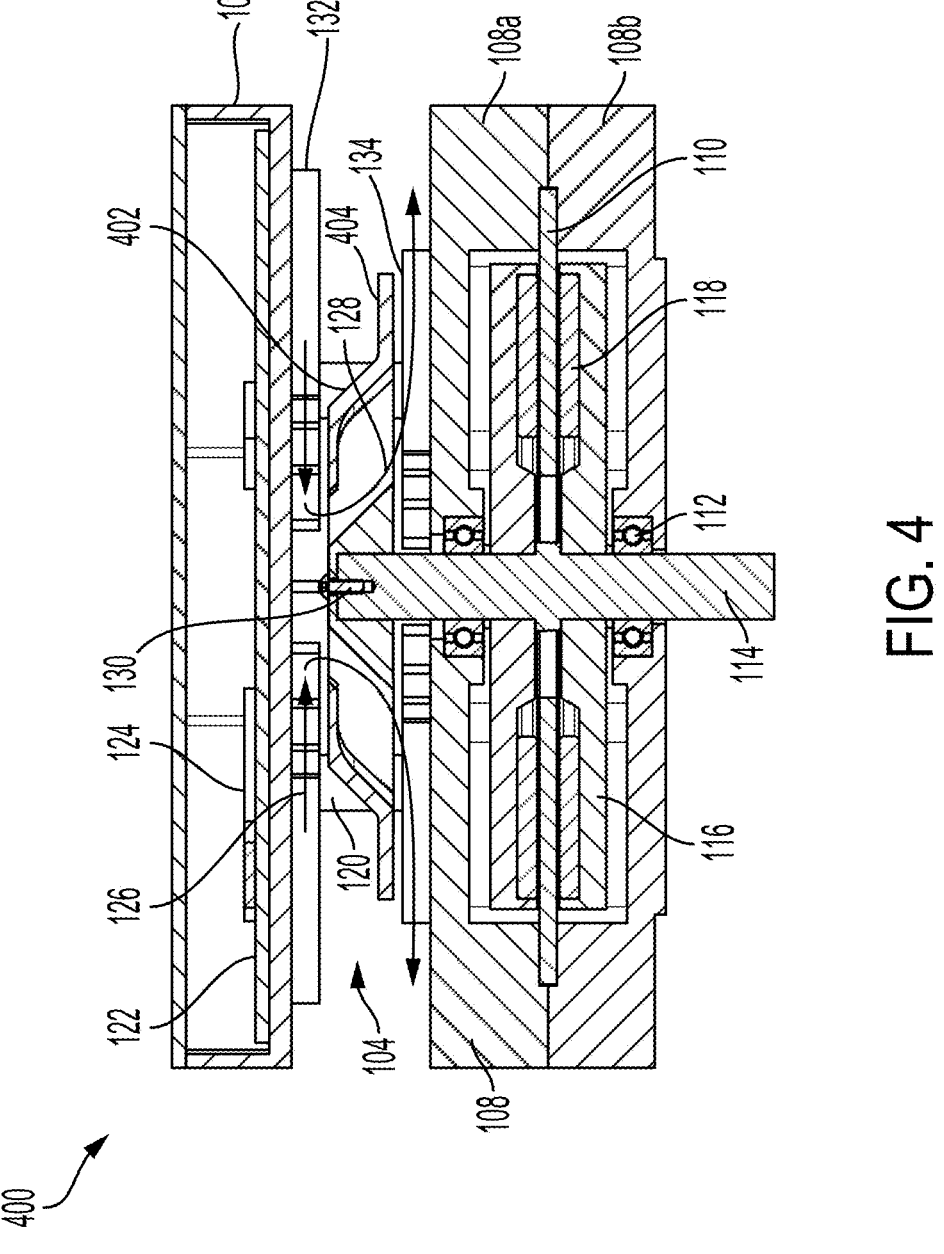
FIG. 4 shows how a second example centrifugal fan component, configured in accordance with some implementations of the present disclosure, may be disposed between a drive housing and a motor/generator housing of an integrated axial flux machine.
Figure 5:
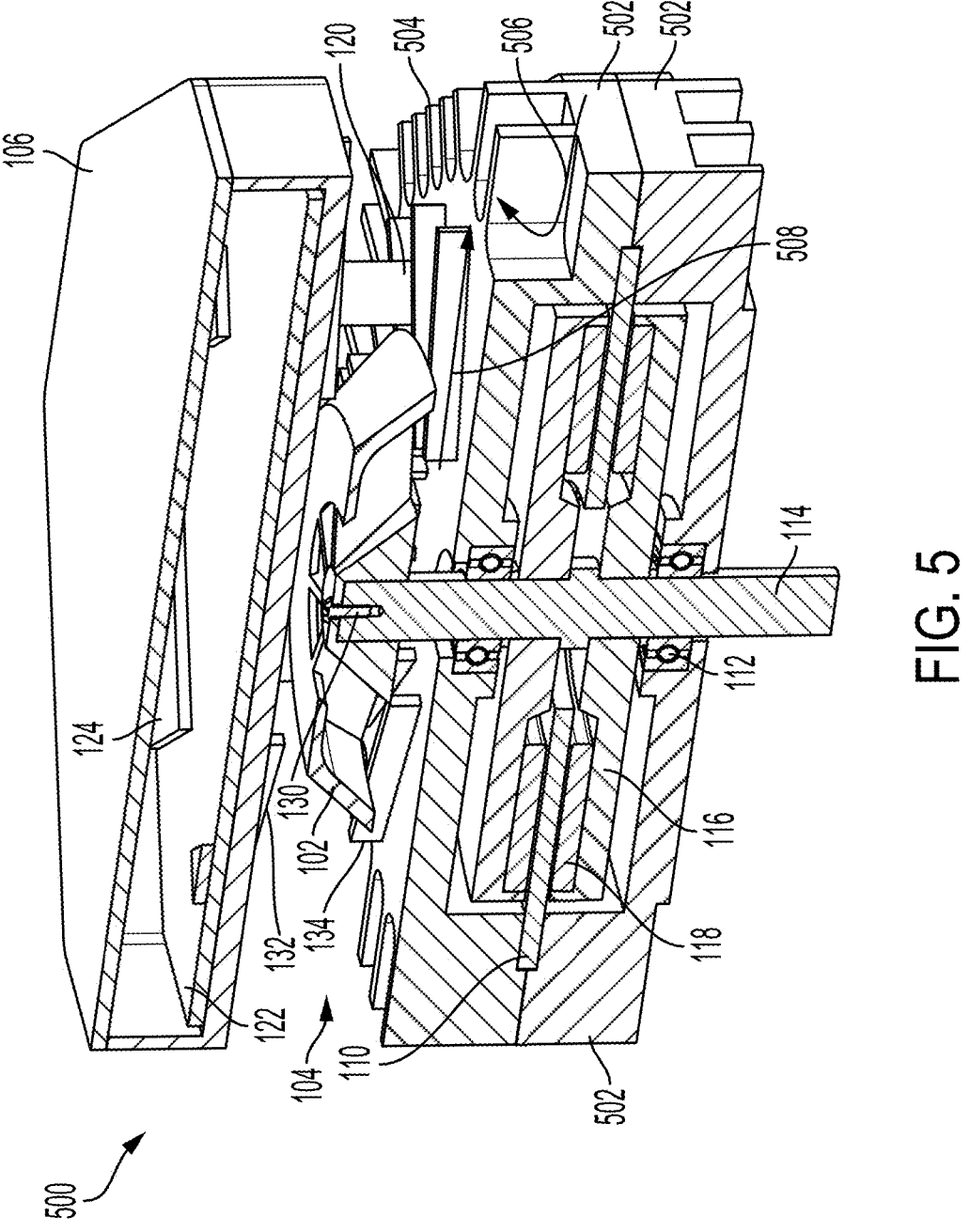
FIG. 5 shows how a motor/generator housing of an integrated axial flux machine may include additional fins arranged to be cooled by fluid flow generated by a centrifugal fan component configured in accordance with some implementations of the present disclosure.
Figure 6:
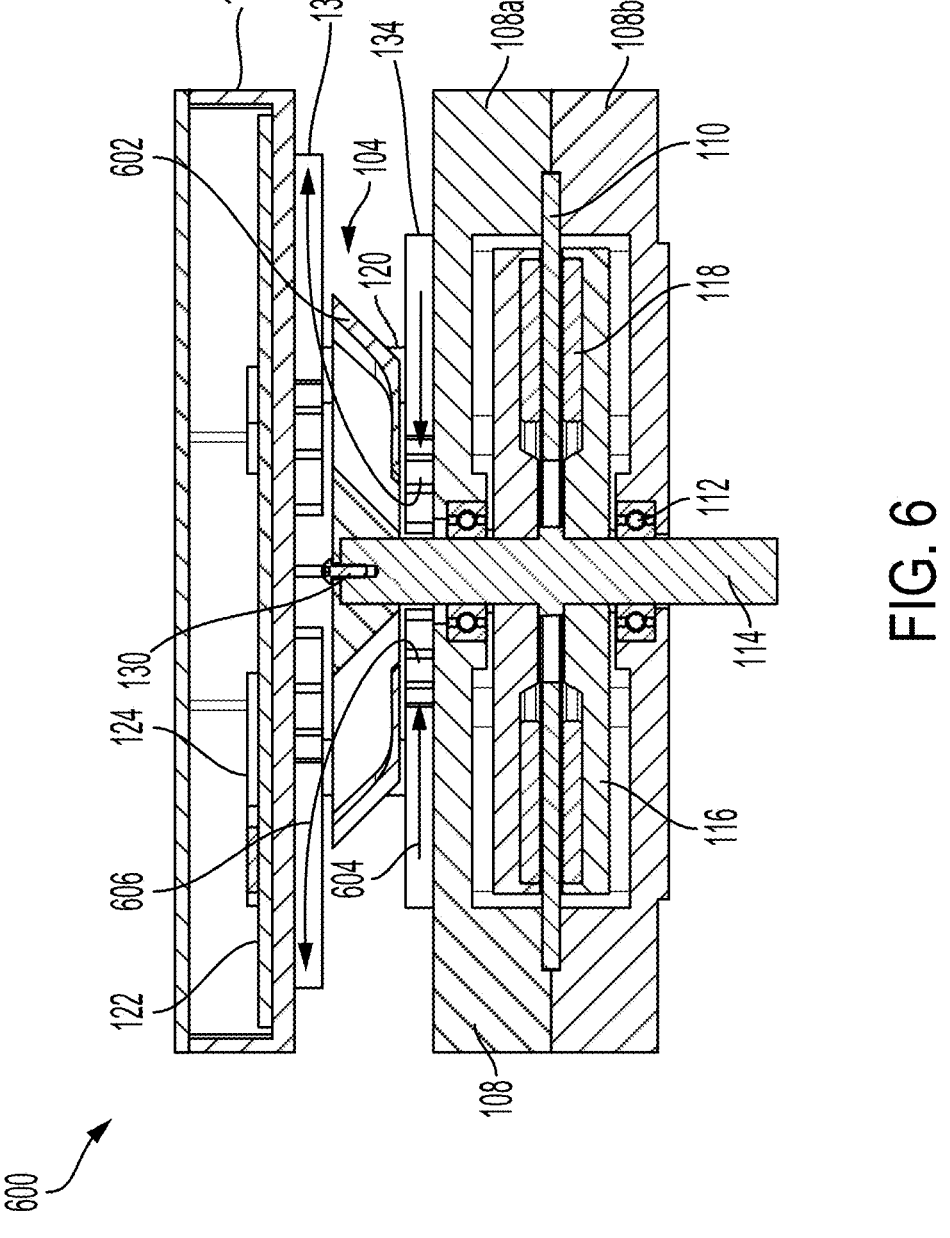
FIG. 6 shows how a third example centrifugal fan component, configured in accordance with some implementations of the present disclosure, may be disposed between a drive housing and a motor/generator housing of an integrated axial flux machine, so as to generate a fluid flow opposite the fluid flow generated by the centrifugal fan components shown in FIGS. 1-5.

Example raxial flow fans 102, 402, 602 are shown in FIGS. 1-6, with FIGS. 1, 4, 5, and 6 illustrating examples of integrated axial flux machines 100, 400, 500, 600 respectively, in which such raxial flow fans 102, 402, 602 may be included. In particular, FIG. 1 shows how the raxial flow fan 102 may be disposed in a space 104 between a drive housing 106 and a motor/generator housing 108 of the example integrated axial flux machine 100, FIG. 4 shows how the raxial flow fan 402 may be disposed in the space 104 between the drive housing 106 and the motor/generator housing 108 of the example integrated axial flux machine 400, FIG. 5 shows how the raxial flow fan 102 may be disposed in the space 104 between the drive housing 106 and a motor/generator housing 502 of the example integrated axial flux machine 500, and FIG. 6 shows how the raxial flow fan 602 may be disposed in the space 104 between the drive housing 106 and the motor/generator housing 108 of the example integrated axial flux machine 600.

The raxial flow fan 602 (shown in FIG. 6) is similar to the raxial flow fan 102 (shown in FIGS. 1, 2, 3, and 5), except for the configuration of its central section and the orientation in which it attaches to a shaft 114, with the raxial flow fan 602 of the integrated axial flux machine 600 being inverted as compared to the raxial flow fan 102 of the integrated axial flux machines 100 and 500, so as to cause the raxial flow fan 602 to generate fluid flow (e.g., airflow) opposite to the fluid flow (e.g., airflow) generated by the integrated axial flux machines 100 and 500.

The raxial flow fan 402 (shown in FIG. 4) differs from the raxial flow fans 102, 602 (shown in FIGS. 1-3, 5 and 6) in that its integrated baffle includes a flat section 404 incorporated radially outward of the fan to prevent outflow cooling fluid (e.g., outflow air) from circulating into the inflow.

The example integrated axial flux machine 500 (shown in FIG. 5) differs from the example integrated axial flux machines 100, 400, 600 (shown in FIGS. 1, 4 and 6) in that it includes additional fins 504 which surround the motor/generator housing 502 and are cooled via movement of cooling fluid (e.g., air) not directly aligned with the raxial flow fan 102 (e.g., as illustrated by the fluid flow indicators 506 and 508 shown in FIG. 5). Although not separately illustrated, it should be appreciated that, in some implementations, the example raxial flow fan 402 (including the flat section 404) shown in FIG. 4 may likewise be employed in the space 104 between the drive housing 106 and the motor/generator housing 502 (including the fins 504) shown in FIG. 5. Furthermore, although also not shown in the figures, it should be appreciated that a central section of the raxial flow fan 402 (shown in FIG. 4) may likewise be configured similar to the central section of the raxial flow fan 602 (shown in FIG. 6), so that it may be inverted in a similar manner to the raxial flow fan 602 and thereby generate a fluid flow (e.g., airflow) opposite to the fluid flow (e.g., airflow) generated by the integrated axial flux machine 400.

As shown in FIGS. 1, 4, 5, and 6, in some implementations, the motor/generator housing 108, 502 may support a stator (e.g., a PCB stator 110) in a fixed position (e.g., between respective housing portions 108a, 108b, 502a, 502b) and may include bearings 112 that allow the shaft 114 to rotate relative to the motor/generator housing 108, 502 and the PCB stator 110. As also shown, in some implementations, one or more back irons 116 (supporting permanent magnets 118) may be fixedly attached the shaft 114, so that the shaft 114, the back iron(s) 116, and the magnets 118 can rotate, as a unit, relative to the PCB stator 110.

As also illustrated in FIGS. 1, 4, 5 and 6, in some implementations, the drive housing 106 may be fixedly attached to the motor/generator housing 108, 502 (e.g., via one or more standoffs 120) to form the space 104 between the drive housing 106 and the motor/generator housing 108, 502. In some implementations, the drive housing 106 may contain one or more printed circuit boards 122 supporting power electronic components 124 to control current through the windings of the PCB stator 110 to cause the integrated axial flux machine 100, 400, 500, 600 to operate as a motor and/or generator.

As shown in FIGS. 1, 4, 5, and 6, the raxial flow fan 102, 402, 602 may be fixedly attached to the shaft 114 (e.g., via a screw 130 or other fastener) so that the raxial flow fan 102, 402, 602 rotates together with the shaft 114. As illustrated by the fluid flow indicators 126, 128 shown in FIGS. 1 and 4 and the fluid flow indicators 604 and 606 shown in FIG. 6, rotation of the raxial flow fan 102, 402, 602 may cause cooling fluid (e.g., air) to be drawn into inlet holes 208 (see FIGS. 2 and 3) at the top of the raxial flow fan 102, 402, 602 and forced out of the raxial flow fan 102, 402, 602 in a raxial direction.

As shown in FIGS. 2 and 3, in some implementations, the raxial flow fan 102, 402, 602 may include a baffle 202 disposed around the outer diameter of a centrifugal fan with straight blades 204. As shown, the baffle 202 may include an outer portion that is positioned on an axial side of the centrifugal fan and at least partially covers gaps between the blades 204 adjacent an outer periphery of the centrifugal fan, with the outer portion being configured and arranged to redirect the flow of the cooling fluid at least partially in the axial direction. For example, as illustrated, at least a part of the outer portion of the baffle 202 may be angled such that, as the cooling fluid (e.g., air) moves radially outward due to the motion of the centrifugal fan, it is directed at least partially in an axial direction (e.g., as indicated by fluid flow indicators 128 in FIGS. 1 and 4 and the fluid flow indicator 606 in FIG. 6). The resultant fluid flow (e.g., airflow) may thus have both an axial component and a radial component as it exits the raxial flow fan 102, 402, 602 and, as such, may be directed at the housing of the other component to be cooled (e.g., the motor/generator housing 108, 502 of the integrated axial flux machines 100, 400 and 500 or the drive housing 106 of the integrated axial flux machine 600). As also illustrated in FIGS. 2 and 3, the inner diameter of the raxial flow fan 102, 402, 602 may also include a tapered region 206 that is angled in the same direction as the baffle 202. The symmetric design with straight blades 204 means that the raxial flow fan 102, 402, 602 may cause cooling fluid (e.g., air) to flow in the same direction, regardless of the direction of rotation of the shaft 114.

As shown in FIGS. 2 and 3, in some implementations, one axial side of the raxial flow fan 102, 402, 602 may include a recess 302 (see FIG. 3) configured to receive an end of the shaft 114 and the other axial side of the raxial flow fan 102, 402, 602 may include a hole 212 (see FIG. 2) configured to receive a screw 130 or other fastener to secure the raxial flow fan 102, 402, 602 to the end of the shaft 114, e.g., as illustrated in FIGS. 1, 4, 5, and 6.

As also shown in FIGS. 2 and 3, in some implementations, the inlet side of the raxial flow fan 102, 402, 602 may be partially covered with a planar component 210 that limits the size of the inlet holes 208. The size of the planar component 210 may be adjusted to limit the amount of fluid flow (e.g., airflow) such that the raxial flow fan 102, 402, 602 may be optimized to provide sufficient cooling without excessive drag torque (which increases as the fluid flow, e.g., airflow, through the raxial flow fan 102, 402, 602 increases).

As shown in FIGS. 1, 4, 5, and 6, in some implementations, the drive housing 106 may include fins 132 or other features to increase the surface area of the drive housing 106 over which the cooling fluid (e.g., air) flows as a result of the rotation of the raxial flow fan 102, 402, 602. Similarly, as also shown in FIGS. 1, 4, 5, and 6, in some implementations, the motor/generator housing 108, 502 may likewise include fins 134 or other features to increase the surface area of the motor/generator housing 108, 502 over which the cooling fluid (e.g., air) flows as a result of the rotation of the raxial flow fan 102, 402, 602. In some implementations, the cooling features (e.g., fins 132, 134) on the drive housing 106 and/or the motor/generator housing 108, 502 may not be limited to the area immediately surrounded by the raxial flow fan 102, 402, 602. The cooling fluid flow produced by the raxial flow fan 102, 402, 602 may additionally cause movement of cooling fluid (e.g., air) which may improve cooling nearby. For instance, as shown in FIG. 5, in some implementations, additional fins 504 may be placed around the outer radius of the motor/generator housing 502 and cooled by fluid (e.g., air) which is drawn into the low pressure radial outflow cooling fluid, e.g., as illustrated by fluid flow indicators 506 and 508 in FIG. 5.

The following clauses describe example implementations of apparatuses in accordance with some aspects of the present disclosure.

Clause 1. An apparatus, comprising: a first housing supporting an axial flux machine including a stator and a rotor configured to rotate about an axis of rotation, wherein the stator includes conductive windings, and the rotor includes a shaft and one or more magnets to generate magnetic flux that links with the conductive windings; a second housing supporting power electronic components to control current flow through the conductive windings, the second housing being axially spaced from the first housing to form a gap between a first surface and a second surface that faces the first surface, wherein the first surface is on one of the first housing and the second housing and the second surface is on another of the first housing and the second housing; and a centrifugal fan positioned in the gap and coupled to the shaft so that the centrifugal fan rotates about the axis of rotation, the centrifugal fan including: blades extending in a radial direction to generate fluid flow in the radial direction, and a baffle attached to the blades, the baffle being configured and arranged (i) to cause cooling fluid to be drawn into one or more first openings on a first axial side of the centrifugal fan that faces the first surface, thereby generating a first flow of cooling fluid in an inward radial direction over the first surface, and (ii) to redirect the fluid flow at least partially in an axial direction toward the second surface so that the cooling fluid is expelled from one or more second openings on a second axial side of the centrifugal fan that faces the second surface, thereby causing a second flow of cooling fluid in an outward radial direction over the second surface.

Clause 2. The apparatus of clause 1, wherein the first surface is on the first housing and the second surface is on the second housing.

Clause 3. The apparatus of clause 1, wherein the first surface is on the second housing and the second surface is on the first housing.

Clause 4. The apparatus of any of clauses 1-3, wherein the blades are straight.

Clause 5. The apparatus of clause 4, wherein the blades are oriented in respective planes parallel to the axis of rotation.

Clause 6. The apparatus of clause 5, wherein the respective planes are coincident with the axis of rotation.

Clause 7. The apparatus of any of clauses 1-5, wherein the baffle includes an outer portion that is positioned on a first axial side of the centrifugal fan and at least partially covers gaps between the blades adjacent an outer periphery of the centrifugal fan, the outer portion being configured and arranged to redirect the fluid flow at least partially in the axial direction toward the second surface.

Clause 8. The apparatus of clause 7, wherein the outer portion extends in a raxial direction so as to redirect the fluid flow in the raxial direction.

Clause 9. The apparatus of clause 7 or clause 8, wherein the one or more first openings are positioned adjacent an inner periphery of the centrifugal fan.

Clause 10. The apparatus of clause 9, wherein the baffle further includes a first generally annular section positioned on the first axial side radially inward of the outer portion such that a radial width of the first generally annular section defines a size of the one or more first openings.

Clause 11. The apparatus of clause 10, wherein the baffle further includes a second generally annular portion positioned radially outward of the outer portion.

Clause 12. The apparatus of clause 11, wherein the second generally annular portion is positioned on a second axial side of the centrifugal fan opposite the first axial side.

Clause 13. The apparatus of any of clauses 7-12, wherein the centrifugal fan includes an inner portion that is tapered in a same direction as the outer portion about the axis of rotation so as to form channels for fluid flow.

Clause 14. The apparatus of any of clauses 1-13, wherein the first surface includes first fins defining first fluid flow channels for the first flow of cooling fluid in the inward radial direction and the second surface includes second fins defining second fluid flow channels for the second flow of cooling fluid in the outward radial direction.

Clause 15. A method for using the apparatus of any of clauses 1-14, comprising: operating the power electronic components to control current flow through the conductive windings to cause rotation of rotor and shaft and thereby cause rotation of the blades of the centrifugal fan to generate the fluid flow in the radial direction.

Clause 16. An apparatus, comprising: a centrifugal fan including blades extending in a radial direction to generate fluid flow in the radial direction and a baffle attached to the blades to redirect the fluid flow at least partially in a first axial direction.

Clause 17. The apparatus of clause 16, further comprising: an axial flux machine including a stator, a rotor, and a shaft that rotates about an axis of rotation of the rotor; and a drive for the axial flux machine which separated axially from the axial flux machine; wherein the centrifugal fan is disposed in an axial space between the axial flux machine and the drive.

Clause 18. The apparatus of clause 16 or clause 17, wherein the blades are straight.

Clause 19. The apparatus of clause 18, wherein the blades are oriented in respective planes parallel to an axis of rotation of the centrifugal fan.

Clause 20. The apparatus of clause 18, wherein the respective planes are coincident with the axis of rotation.

Clause 21. The apparatus of any of clauses 16-20, wherein the baffle includes an outer portion that is positioned on a first axial side of the centrifugal fan and at least partially covers gaps between the blades adjacent an outer periphery of the centrifugal fan, the outer portion being configured and arranged to redirect the fluid flow at least partially in the first axial direction.

Clause 22. The apparatus of clause 21, wherein the outer portion extends in a raxial direction so as to redirect the fluid flow in the raxial direction.

Clause 23. The apparatus of clauses 21 or 22, wherein the baffle includes one or more openings positioned on the first axial side and adjacent an inner periphery of the centrifugal fan to allow inflow of cooling fluid for at least a portion of the fluid flow generated by the blades.

Clause 24. The apparatus of clause 23, wherein the baffle further includes a first generally annular section positioned on the first axial side radially inward of the outer portion such that a radial width of the first generally annular section defines a size of the one or more openings.

Clause 25. The apparatus of any of clauses 21-24, wherein the baffle further includes a second generally annular portion positioned radially outward of the outer portion.

Clause 26. The apparatus of clause 25, wherein the second generally annular portion is positioned on a second axial side of the centrifugal fan opposite the first axial side.

Clause 27. The apparatus of any of clauses 21-26, wherein the centrifugal fan includes an inner portion that is tapered in a same direction as the outer portion about an axis of rotation of the centrifugal fan so as to form channels for the fluid flow that extend in a raxial direction.

Having thus described several aspects of at least one embodiment, it is to be appreciated that various alterations, modifications, and improvements will readily occur to those skilled in the art. Such alterations, modifications, and improvements are intended to be part of this disclosure, and are intended to be within the spirit and scope of the disclosure. Accordingly, the foregoing description and drawings are by way of example only.

Various aspects of the present disclosure may be used alone, in combination, or in a variety of arrangements not specifically discussed in the embodiments described in the foregoing and is therefore not limited in this application to the details and arrangement of components set forth in the foregoing description or illustrated in the drawings. For example, aspects described in one embodiment may be combined in any manner with aspects described in other embodiments.

Also, the disclosed aspects may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc. in the claims to modify a claim element does not by itself connote any priority, precedence or order of one claim element over another or the temporal order in which acts of a method are performed, but are used merely as labels to distinguish one claimed element having a certain name from another element having a same name (but for use of the ordinal term) to distinguish the claim elements.

Also, the phraseology and terminology used herein is used for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. An apparatus, comprising:
a first housing supporting an axial flux machine including a stator and a rotor configured to rotate about an axis of rotation, wherein the stator includes conductive windings, and the rotor includes a shaft and one or more magnets to generate magnetic flux that links with the conductive windings;

a second housing supporting power electronic components to control current flow through the conductive windings, the second housing being axially spaced from the first housing to form a gap between a first surface and a second surface that faces the first surface, wherein (i) (i) the first surface is on the first housing and faces away from the stator and the rotor, and the second surface is on the second housing and faces away from the power electronic components, or (ii) the first surface is on the second housing and faces away from the power electronic components, and the second surface is on the first housing and faces away from the stator and the rotor; and a centrifugal fan positioned in the gap and coupled to the shaft so that the centrifugal fan rotates about the axis of rotation, the centrifugal fan including:
blades extending in a radial direction to generate fluid flow in the radial direction, and
a baffle integrated with the blades so that the blades and the baffle rotate as a unit about the axis of rotation, the baffle being configured and arranged (i) to cause cooling fluid to be drawn into one or more first openings on a first axial side of the centrifugal fan that faces the first surface, thereby generating a first flow of cooling fluid in an inward radial direction over the first surface, and (ii) to redirect the fluid flow at least partially in an axial direction toward the second surface so that the cooling fluid is expelled from one or more second openings on a second axial side of the centrifugal fan that faces the second surface, thereby causing a second flow of cooling fluid in an outward radial direction over the second surface, wherein the baffle includes an outer portion that is positioned on a first axial side of the centrifugal fan and at least partially covers gaps between the blades adjacent an outer periphery of the centrifugal fan, the outer portion being configured and arranged to redirect the fluid flow at least partially in the axial direction toward the second surface.

2. The apparatus of claim 1, wherein the first surface is on the first housing and the second surface is on the second housing.

3. The apparatus of claim 1, wherein the first surface is on the second housing and the second surface is on the first housing.

4. The apparatus of claim 1, wherein the blades are straight.

5. The apparatus of claim 4, wherein the blades are oriented in respective planes parallel to the axis of rotation.

6. The apparatus of claim 5, wherein the respective planes are coincident with the axis of rotation.

7. The apparatus of claim 1, wherein the outer portion extends in a raxial direction so as to redirect the fluid flow in the raxial direction.

8. The apparatus of claim 1, wherein the one or more first openings are positioned adjacent an inner periphery of the centrifugal fan.

9. The apparatus of claim 8, wherein the baffle further includes a first generally annular section positioned on the first axial side radially inward of the outer portion such that a radial width of the first generally annular section defines a size of the one or more first openings.

10. The apparatus of claim 9, wherein the baffle further includes a second generally annular portion positioned radially outward of the outer portion.

11. The apparatus of claim 10, wherein the second generally annular portion is positioned on a second axial side of the centrifugal fan opposite the first axial side.

12. The apparatus of claim 1, wherein the centrifugal fan includes an inner portion that is tapered in a same direction as the outer portion about the axis of rotation so as to form channels for fluid flow.

13. The apparatus of claim 1, wherein the first surface includes first fins defining first fluid flow channels for the first flow of cooling fluid in the inward radial direction and the second surface includes second fins defining second fluid flow channels for the second flow of cooling fluid in the outward radial direction.

14. A method for using the apparatus of claim 1, comprising:

operating the power electronic components to control current flow through the conductive windings to cause rotation of rotor and shaft and thereby cause rotation of the blades of the centrifugal fan to generate the fluid flow in the radial direction.

\* \* \* \* \*